April 26, 1966 R. ZULEEG 3,248,672

TRANSISTOR MODULATOR AND OSCILLATOR CIRCUITS PROVIDING POWER OUTPUT BEYOND THE NORMAL CUT-OFF FREQUENCY

Filed Feb. 1, 1961 5 Sheets-Sheet 1

INVENTOR.
RAINER ZULEEG,
BY
Walter J. Adam
ATTORNEY

INVENTOR.
RAINER ZULEEG.
BY
Walter J. Adam
ATTORNEY

INVENTOR.
RAINER ZULEEG,
BY
Walter J. Adam
ATTORNEY.

INVENTOR.
RAINER ZULEEG.
BY
Walter J. Adam
ATTORNEY.

INVENTOR.
RAINER ZULEEG,
BY
Walter J. Adam
ATTORNEY.

United States Patent Office 3,248,672

Patented Apr. 26, 1966

3,248,672

TRANSISTOR MODULATOR AND OSCILLATOR CIRCUITS PROVIDING POWER OUTPUT BEYOND THE NORMAL CUT-OFF FREQUENCY

Rainer Zuleeg, Costa Mesa, Calif., assignor to Hughes Aircraft Company, Culver City, Calif., a corporation of Delaware Filed Feb. 1, 1961, Ser. No. 86,396
6 Claims. (Cl. 332—17)

This invention relates to signal translating circuits utilizing a parametric mode transistor for providing conversion gain and power output beyond the normal cut-off frequency.

Harmonic power generation is conventionally limited to the maximum frequency of oscillation defined in conventional transistors as the frequency at which the gain drops to unity. Also, in frequency conversion or mixing in a mixer oscillator circuit utilizing a transistor, conversion gain conventionally is not attainable above the normal maximum frequency of oscillation. Presently available high-frequency transistors offer a maximum frequency of oscillation around 1 kmc. and generally yield a power gain of about 62 decibels at 450 mc. Conventional transistors are unable to reliably provide conversion gain or power at harmonics of the fundamental frequency of oscillation. Thus, the frequency of operation of conventional transistor circuits is greatly limited.

It is therefore an object of this invention to provide a semiconductor amplifying circuit operable at frequencies substantially above the conventional maximum frequency of oscillation of transistors.

It is a further object of this invention to provide a harmonic generator circuit utilizing an improved transistor so as to develop harmonic power in selected frequency bands substantially above the normal maximum frequency of oscillation of a transistor.

It is a still further object of this invention to provide a mixer oscillator circuit utilizing an improved transistor to develop difference signals with conversion gain in response to input signals at frequencies substantially greater than the normal maximum frequency of oscillation of transistors.

It is another object of this invention to provide an arrangement for tuning an oscillator by varying the direct current applied thereto.

It is still another object of this invention to provide an improved harmonic generator circuit in which the harmonic signals can be modulated.

Briefly, the circuits of this invention develop harmonic signals at frequencies substantially greater than the maximum frequency of oscillation of conventional transistors. In one form the circuit of the invention develops harmonic power and in another form conversion gain is developed by mixing relatively high frequency input signals with harmonics of a local oscillator frequency. A parametric mode transistor utilized in the circuits of the invention has a complex input impedance that varies successively from inductive to capacitive and back to inductive reactance with increasing frequency of oscillation, and at any selected frequency, varies in reactance with emitter current. The transistor provides these characteristics as a result of having specified values of extrinsic base resistance, collector depletion layer capacitance and electric drift field. The circuits include a fixed inductance coupled between the emitter electrode of the transistor and a variable source of current. The base and collector electrodes are coupled to tuned circuits to form harmonic waves or in response to an input signal applied to the emitter electrode to perform mixing. The circuits are tuned for operation by varying the direct current applied to the emitter electrode so that the complex input impedance has a minimized real value.

The novel features which are believed to be characteristics of the invention, both as to its organization and method of operation, together with further objects and advantages thereof, will be better understood from the following description considered in connection with the accompanying drawings, in which like characters refer to like parts, and in which.

Referring first to the equivalent circuit diagram of FIG. 1, the general characteristics of the parametric mode transistor utilized in this invention will be described. The transistor utilized in the invention provides amplification and power generation at frequencies substantially beyond the normal frequency of oscillation of conventional transistors. When utilized in a mixer-oscillator circuit, the parametric transistor operates in a self-pumping mode to provide conversion gain at frequencies above the normal limiting cut-off frequency. In a harmonic power generation mode of operation, the parametric transistor develops power gain at harmonics of the fundamental frequency of oscillation and in selected frequency bands substantially above the limiting cut-off frequency of conventional transistors. The parametric mode transistor may be generally defined having a drift field greater than a specified value to provide a desired current amplification factor $\alpha$, an extrinsic base resistance $r_b'$ below a specified value, a collector layer capacitance $C_c$ below a specified value and a relatively high power rating. It is to be recognized that some of the properties of the parametric mode transistor utilized in this invention have been found by applicant by testing in selected units of certain commercial transistors.

Figure 1:
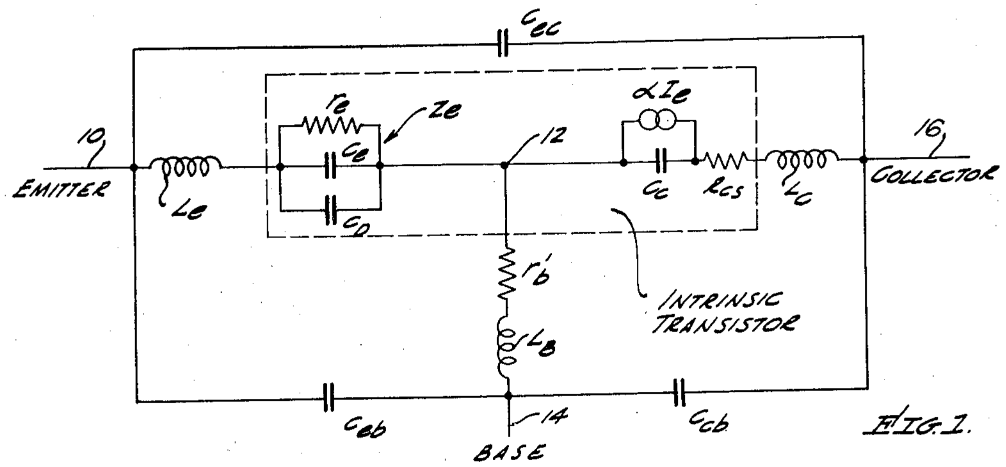
FIG. 1 is an equivalent circuit diagram of the transistor in accordance with this invention including parasitic elements.

The equivalent circuit diagram of FIG. 1 shows an emitter impedance $Z_e$ including an emitter differential resistance $r_e$ and emitter capacitances $C_e$ (emitter depletion layer capacitance) and $C_D$ (diffusion capacitance), all coupled in parallel between an emitter electrode 10 and the base region represented by a lead 12. The base region includes an extrinsic base resistance $r_b'$ coupled between the lead 12 and a base electrode 14 and resulting from the connection of the base electrode to the base material. Coupled between the base region at the lead 12 and a collector electrode 16 is a collector junction capacitance $C_c$ and a parallel coupled current generator $(\alpha \times I_e)$ where $\alpha$ is the current amplification factor and $I_e$ is the emitter current. The collector junction capacitance $C_c$ is a function of the collector-to-base area and the width of the depletion region. Also, coupled between the collector electrode 16 and the collector capacitance $C_c$ is a collector bulk series resistance $R_{cs}$. This series resistance $R_{cs}$ is undesirable in the microwave frequency range and causes power losses. Modern techniques, such as epitaxial vapor deposition, can remove or at least minimize this parameter.

The schematic diagram also includes extrinsic parasitic elements which are inductances $L_e$, $L_b$ and $L_c$ connected respectively between the emitter, base and collector electrodes and the intrinsic transistor and resulting from inductance developed by external connections to the semiconductor electrodes of the transistor. Other external parasitic elements are an emitter-to-base capacitance $C_{eb}$, a collector-to-base capacitance $C_{cb}$ and an emitter-to-collector capacitance $C_{ec}$ all developed between the external connections of the transistor. It is to be noted at this time that the extrinsic parasitic elements ($L_e$, $L_b$, $L_c$) may be minimized for improved operation of the transistor utilized in this invention by proper high-frequency packaging such as strip-line or coaxial-line designs.

reactive and the passive or real parts of the emitter im-

Figure 2:
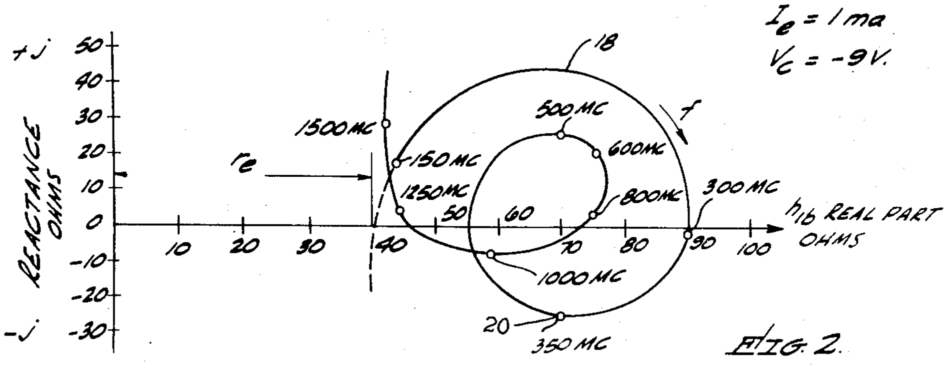
FIG. 2 is a graph of the reactive and real part of the input impedance as a function of frequency for an emitter current of 1 ma. (milliampere) to explain the characteristics of the transistor in accordance with this invention.
Figure 3:
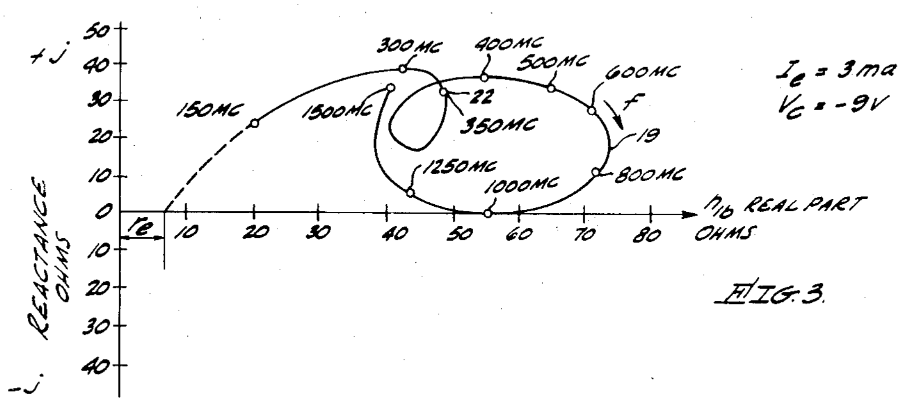
FIG. 3 is a similar graph of the reactive and real part of the input impedance as a function of frequency for an emitter current of 3 ma. to explain the characteristics of the transistor in accordance with this invention.

The measured complex input impedance $h_{ib}$, that is the reactive and the passive or real parts of the emitter impedance $Z_e$, of the parametric mode transistor of this invention is shown by curves 18 and 19 in FIGS. 2 and 3 as a function of frequency for two emitter current levels of respectively 1 ma. (milliampere) and 3 ma. at a constant −9 volt collector voltage. The curves 18 and 19 show special $h_{ib}$ characteristics inherent in these transistors resulting from the $\alpha$ characteristics thereof. In FIGS. 2 and 3 the complex input impedance $h_{ib}$ is shown on the Y axis in ohms as $+j$ for an inductive reactance and as $-j$ for a capacitive reactance and the real part of the input impedance is shown in ohms on the X axis. Considering a point 20 on the curve 18 of FIG. 2 which point is obtained at a frequency of 350 mc. as shown with an emitter current $I_e$ of 1 ma., the imaginary part of $h_{ib}$ is equal to $-j25$ ohms. At the same frequency of 350 mc. in FIG. 3 at a point 22 on the curve 19 but with an emitter current $I_e$ of 3 ma., the imaginary part of $h_{ib}$ is equal to $+j36$ ohms. Thus, the input impedance $h_{ib}$ must pass through the real axis within the current range of 1 ma. to 3 ma. and, as will be discussed subsequently, allows the transistor to be tuned to a stable condition of operation. It is to be noted that 350 mc. is only one of a plurality of frequencies at which the input impedance passes through the real axis as the emitter current is varied as will be readily apparent from an inspection of FIGS. 2 and 3. At an emitter current of approximately 2 ma., the point 20 at 350 mc. is on the real axis representing what is called here a tuned condition as will be explained subsequently.

The emitter differential resistance $r_e$ is found on the real axis by extrapolating the curves 18 and 19 to zero frequency as shown in dotted lines. It is to be noted at this time that the resistance $r_e$ at zero frequency represents the real value of the input impedance $Z_e$ at the resonant or current tuned operating condition of the transistor utilized in this invention.

Figure 4:
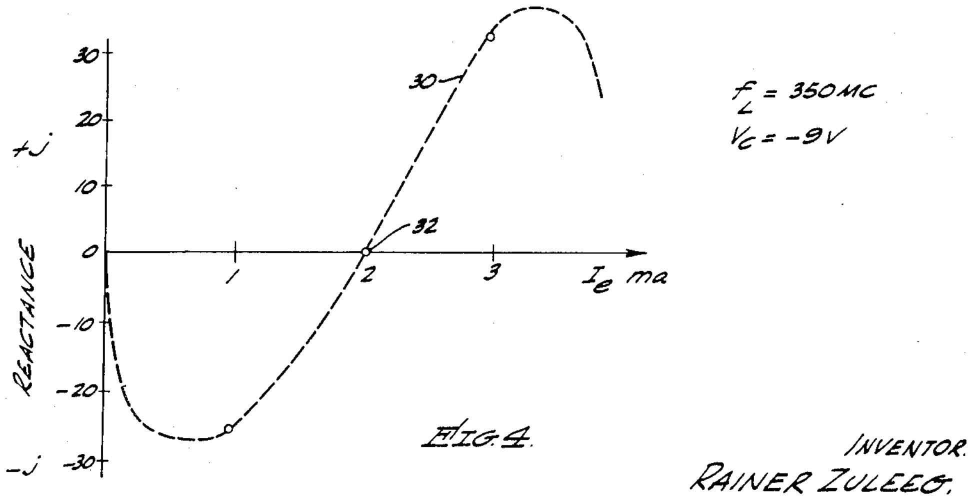
FIG. 4 is a graph of the reactive part of the input impedance versus emitter current at a fixed frequency of the transistor in accordance with this invention having characteristics of the graphs of FIGS. 2 and 3.

A curve 30 of FIG. 4 at the frequency of 350 mc. shows the reactive input impedance versus emitter current relation having a variable non-linear reactance around a point 32 where the emitter current $I_e$ is approximately 2 ma. Thus, for a particular frequency, the input impedance $h_{ib}$ can selectively be made real for a specific D.C. (direct current) emitter current. Selecting the D.C. emitter current condition so that the input impedance is real and minimized such as shown by the point 32 is current tuning of the parametric mode transistor and enables the transistor to operate at a resonant condition and provides maximum conversion gain. When the current tuned transistor oscillates, a variable non-linear reactance is present to develop harmonic signals with a maximum conversion gain when utilized in a mixer-oscillator arrangement of the invention and with power when utilized in a harmonic power generator of the invention. It is to be noted that the curves of FIGS. 2, 3 and 4 as well as FIGS. 12, 13 and 14 which will be explained subsequently have been published on page 1786 of the Proceedings of the IRE, vol. 48, No. 10, October 1960.

The complex input impedance $h_{ib}$ is related to the $\alpha$ or current amplification factor of the transistor by the relation $$h_{ib} = r_e + r_b'(1-\alpha) \qquad (1)$$

where $r_e$ is the emitter differential resistance shunted by the depletion layer capacitance ($C_e$) and the diffusion capacitance ($C_D$) as shown in FIG. 1.

$r_b'$ is the extrinsic base resistance as shown in FIG. 1.

The $\alpha$ current amplification factor is expressed by the relation $$\alpha = \frac{\alpha^0 \exp.\,(-jmf/f_b)}{1+j(f/f_b)} \qquad (2)$$

where $\alpha_0$ is the low frequency alpha of the transistor which may be assumed to be equal to 1.0 for a good transistor.

$f$ is the frequency of operaton.

$f_b$ is the base cut-off frequency of the transistor.

$m$ is a measure for the drift or diffusion signal-phase properties of the transistor at the cut-off condition in excess of 45°. For a drift transistor $m$ is in excess of .21.

The maximum frequency of oscillation, that is the frequency where the gain has dropped to unity, may be defined by $$f_{MAX} \simeq \sqrt{\frac{f_b}{8\pi r_b' C_c}} \qquad (3)$$

Equation 3 indicates that about $f_{MAX}$ amplification and power gain are not possible. However, the solution of this equation is based on a collector RC (resistance-capacitance) cut-off frequency $f_c$. This equation is not true for a transistor with a high drift field and a cut-off behavior according to Equation 2. Theoretically it can be shown that the gain function U based on an RC cut-off $f_o$ is:

$$U=\frac{f_b}{8\pi r_b' C_c f^2} \quad (4)$$

Figure 5:
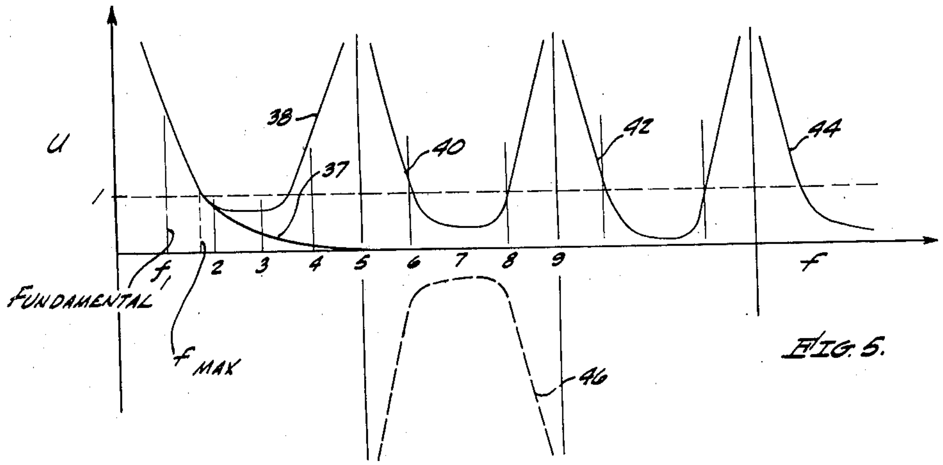
FIG. 5 is a graph of gain versus frequency for explaining the operation of the transistor in accordance with this invention when operating in a mixer oscillator circuit.

A curve 37 of FIG. 5 shows the gain U derived from Equation 4, the gain being less than unity above the conventional maximum frequency of oscillation $f_{MAX}$.

However, a drift transistor utilized in the circuits of this invention has a gain function U of:

$$U=\frac{f_b}{8\pi r_b' C_c f^2\left[\left(\frac{f_b}{f}\right)\sin m\left(\frac{f}{f_b}\right)+\cos m\left(\frac{f}{f_b}\right)\right]} \quad (5)$$

This gain function U is represented in FIG. 5 by curves 38, 40, 42 and 44 and reveals that there are narrow frequency bands above $f_{MAX}$ with gain substantially greater than unity.

The power gain U in a conventional transistor is thus limited to a region below the maximum frequency of oscillation $f_{MAX}$, that is, where the gain drops to unity, as shown by the curve 37 of FIG. 5. With the $\alpha$ characteristics of the transistor utilized in this invention and operating as a harmonic generator, the gain function U versus frequency $f$ varies as curves 38, 40, 42 and 44. A curve 46 shown dotted represents the theoretical operation of the transistor when the input impedance $Z_e$ is zero and shows frequency regions of negative gain which is equivalent to negative resistance. Thus, dotted curve 46 predicts harmonic power generation in the frequency region thereof.

The Equation 5 shows that under certain emitter current conditions a negative resistance region is present at periodic frequency regions, thus predicting conversion gain and power gain.

It should be noted here that this negative resistance arises from the finite transit-time of minority carriers through the base region of the transistor. Due to this transit-time, phase relations between input and output signals can be established which convert the transistor to a negative-resistance, two-terminal device. The frequency spectrum of the described transistor can therefor be divided into alternating frequency bands of a three-terminal and a two-terminal mode, which corresponds respectively to positive and negative gain. This is indicated in FIG. 5 by curves 38, 42, 44 for the three-terminal mode and by dashed curve 46 for the two-terminal or negative resistance mode.

It has been found that when the input impedance $Z_e$ is properly adjusted so the real part takes on small values, the transistor does not exhibit a negative resistance region but has a frequency band shown by a curve 40, where the gain is greater than unity. Thus, the transistor can provide stable power and gain operation at selected high frequency bands when operating with an adjusted emitter impedance $Z_e$ to provide harmonic power generation and or parametric mixing as the non-linear reactance varies during oscillation.

The structural characteristics of the drift field transistor utilized in this invention to provide the non-linear operation will now be further described. It has been found that to provide the $\alpha$ properties and the impedance characteristics of FIGS. 2 and 3 the transistor must include high enough drift fields greater than $$4\frac{KT}{q}$$

to provide sufficient compensating reactance to overcome the parasitic elements. Thus, the variable reactance is effective at minimized real $h_{ib}$, that is, at a current tuned point such as the point 32 of FIG. 4. The drift field $\Delta V$ may be expressed as:

$$\Delta V=\frac{KT}{q}\ln\frac{N_E}{N_c} \quad (6)$$

where

K is Boltzman's constant.
T is absolute temperature in degrees Kelvin.
$q$ is the electron charge in coulombs.
$N_E$ is the impurity concentration of the base region adjacent to the emitter region in atoms/cm.$^3$.
$N_c$ is the impurity concentration of the base region adjacent to the collector region in atoms/cm.$^3$.
$KT/q$ is equal to .025 volt at room temperature.

Thus, a requirement of the transistor utilized in this invention is that the logarithm of the impurity concentration ratio must be selected to give a value of 4 or greater so that the drift field $\Delta V$ must be greater than $$4\frac{KT}{q}$$

or .1 volt. With a base width of 1 micron ($10^{-4}$ cm.) this field will be 1000 volts/cm. It is to be noted that practical limitations of the concentrator ratio may limit the drift field $\Delta V$ to a maximum value of $$8\frac{KT}{q}$$

Figure 6:
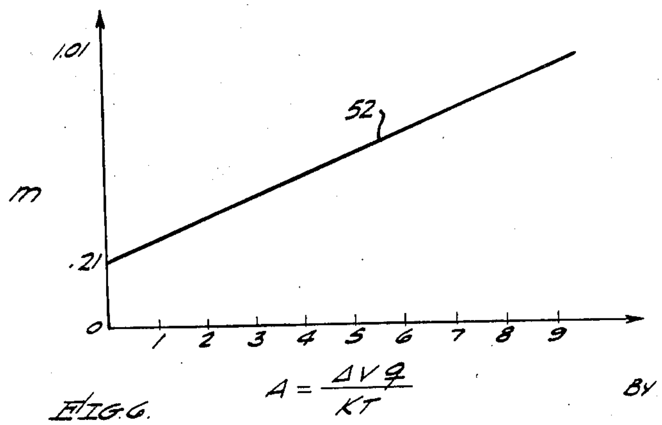
FIG. 6 is a graph of the phase factor *m* versus the drift field factor A for explaining the field requirements of the transistor in accordance with this invention.

To further consider the drift field $\Delta V$, the phase factor $m$ which is contained in the $\alpha$ Equation 2 varies with $$A=\frac{\Delta Vq}{KT}$$

as shown by a curve 52 of FIG. 6 and may be expressed by the equation $$m=.21+A(.1) \quad (7)$$

where A is a measure of the drift potential which is a function of $$\ln=\frac{N_E}{N_G} \quad (6)$$

In the drift field transistor utilized in this invention, $m$ is is greater than .21, that is, A is not equal to zero.

Figures 7, 13, 14:
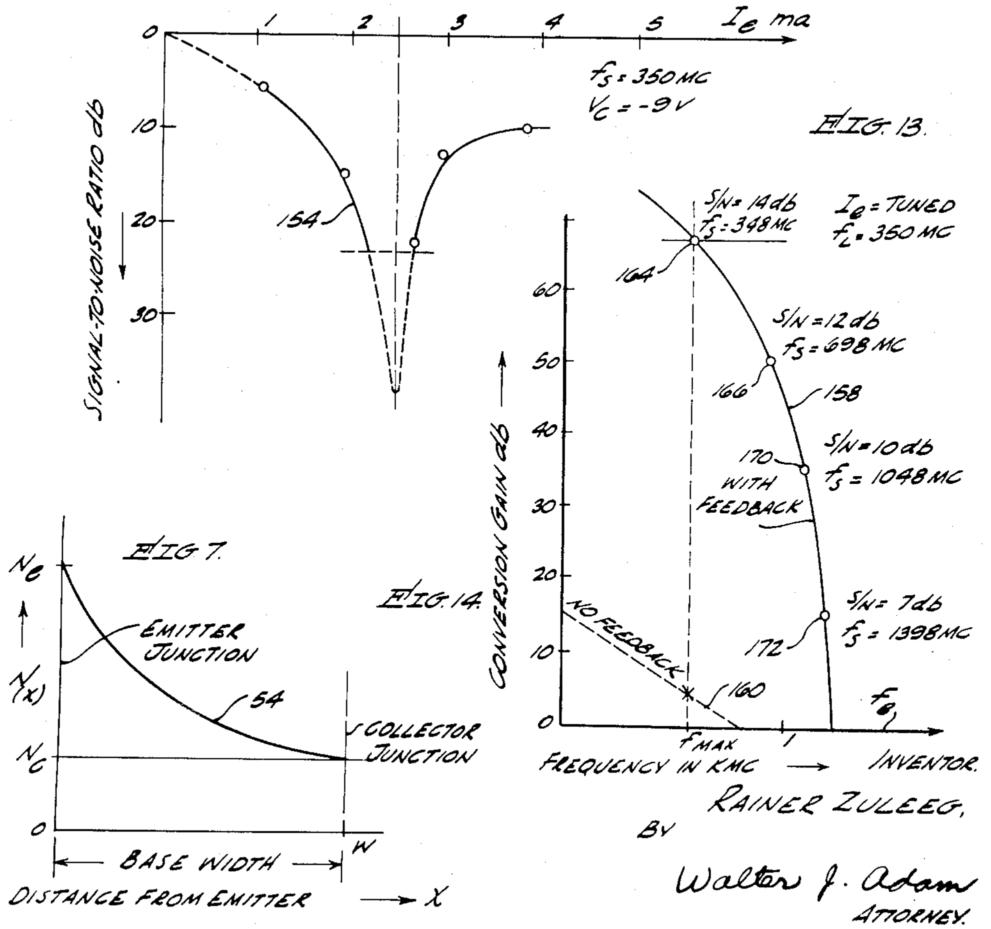
FIG. 7 is a graph of the impurity concentration in the base region versus distance across the base region for further explaining the drift field requirements of the transistor in accordance with this invention.
FIG. 13 is a graph of signal-to-noise ratio versus emitter current for explaining the variation of signal-to-noise ratio with conversion gain shown in FIG. 12.
FIG. 14 is a graph of conversion gain versus frequency for further explaining the operating characteristics of the transistor in accordance with this invention above the conventional maximum frequency of oscillation when utilized in the circuit of FIG. 10.

To further explain the impurity concentration ratio $N_e/N_c$ to obtain the required drift field, FIG. 7 shows an exponentially varying impurity distribution 54 for developing a desired drift field across the base of the transistor. The impurity concentration $N_{(x)}$ as a function of distance X across the base, which is assumed to be an exponential one may be expressed as:

$$N_{(x)}=N_e\exp.\left[-\frac{x}{x_o}\right] \quad (8)$$

where $$N_{(x)}=N_e \text{ at } X=0$$

and $$N_{(x)}=N_c \text{ at } X=W$$

where W is the total distance across the base region between the emitter and collector.
$x_o$ is a characteristic parameter of the diffusion process used to produce the impurity gradient.

The Expression 6 further clarifies that the drift field $\Delta V$ is a function of the impurity distribution across the base region. The maximum value of A in germanium has been found to be 8 because the greatest practical impurity ratio is approximately $10^4$ ($N_e=10^{18}$ and $N_c=10^{14}$). Thus, in a germanium transistor, the parametric transistor in accordance with this invention has a drift field $\Delta V$ between $$4\frac{KT}{q} \text{ and } 8\frac{KT}{q}$$

Another requirement of the parametric mode transistor is that the extrinsic base resistance $r_b'$ be less than 20 ohms which is a function of the thickness W of the base region, the average resistivity in the base region and other geometrical factors of the base configuration. The collector capacitance $C_c$ should have a value between 2 and 4 mmf. (micro-microfarads) and is a function of the impurity distribution adjacent to the collector junction and proportional to the area of the junction. The specified $r_b'$ and $C_c$ which provide desired cut-off frequencies will be explained in further detail subsequently relative to a particular structure of a transistor having the parametric properties utilized in this invention. The cut-off frequencies to be considered are the emitter cut-off frequency $f_e$, the base or $\alpha$ cut-off frequency $f_b$ and the collector or the $r_b'$ $C_c$ cut-off frequency $f_c$ and may be expressed as:

$$f_e=\frac{1}{2\pi r_e C_e} \quad (9)$$

$$f_b=\frac{1}{2\pi r_e C_D} \quad (10)$$

$$f_c=\frac{1}{2\pi r_b' C_c} \quad (11)$$

The total cut-off frequency $f_o$ may be expressed as:

$$\frac{1}{f_o}=\frac{1}{f_e}+\frac{1}{f_c}+\frac{1}{f_b} \quad (12)$$

In order to obtain the desired frequency of operation of the parametric transistor, the requirement must be met that $f_e$ and $f_c$ are much larger than $f_b$. Thus, $1/f_e$ and $1/f_c$ have sufficiently small values so that the limit of transistor frequency operation would be essentially a function of the base cut-off frequency $f_b$. The emitter cut-off frequency $f_e$, as will be discussed subsequently, provides an upper frequency limit to the generation of harmonic signals in the parametric mode transistor.

The transistor is provided with a sufficiently large base cut-off frequency $f_b$ by selecting a desirable drift field and base width. The maximum limiting cut-off frequency may also be expressed for a drift transistor as:

$$f_b=\left(\frac{1.21D_p}{W^2\pi}\right)\left(\frac{\Delta Vq}{KT}\right)^{3/2} \quad (13)$$

where $D_p$ is the diffusion constant of the minority carriers in the base region and for $n$ type germanium is equal to 44 cm.²/sec.

W is the effective base width and which is the distance from the emitter to collector junction minus the depletion layer width at the operating collector voltage.

$\Delta V$ is the drift potential in the base of the transistor as produced by the impurity gradient $$\frac{\Delta Vq}{KT}=A$$

as shown in FIG. 6.

Thus, for maximum frequency operation, W must be small and $\Delta V$ must be sufficiently large. Because the emitter differential resistance $r_e$ has the same value and current relation in most transistors, the emitter capacitance $C_e$ is made as small as 4 M.M.F. by reducing the emitter-to-base area so that $f_e$ is sufficiently large.

It has been found that $C_e$ may be made relatively small by forming the emitter junction by applying the end of a small diameter wire containing an impurity to the base material and alloying with a current pulse applied to the wire.

To further explain why the frequencies of the harmonic signals developed by the transistor in this invention are not limited to the speed of particles such as holes moving across the base region, it is presently believed that standing waves of minority carriers may be established across the base region. The signals thus travel across the base in a standing wave or traveling wave pattern at a phase velocity substantially higher than the velocity of the particles. This concept may be compared to traveling wave tube operation whereby the transit-time effect is used to produce amplification and power generation. A similar effect is described in this application which for the first time uses the constant transit-time effect in semiconductor devices. The transistor may hence be referred to as a transit-time device.

Figure 8:
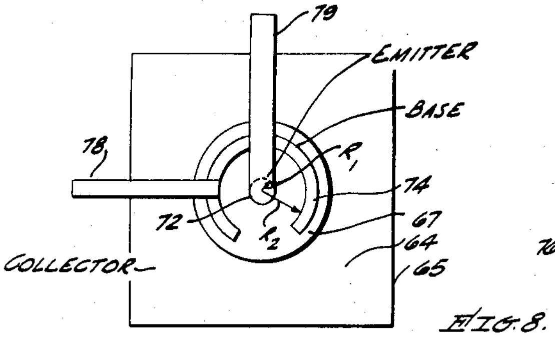
FIG. 8 is a top plan view of a ring type parametric mode mesa transistor having characteristics in accordance with invention.
Figure 9:
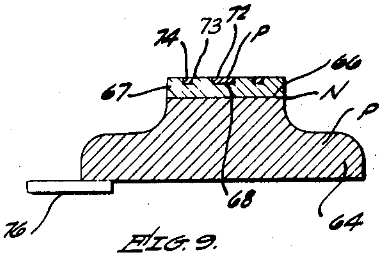
FIG. 9 is a cross sectional elevational view of the parametric mode transistor of FIG. 8.

Referring now to FIGS. 8 and 9 a transistor with mesa type circular geometry as may be utilized in this invention having the characteristics as previously discussed to provide the parametric properties will be explained. The transistor includes a collector 64 of a p-type germanium material having an impurity concentration of $2\times10^{14}$ atoms/cm.³ to provide a 2 ohm-centimeter resistivity $\rho$. The collector 64 as shown in FIG. 9 has a large width at the bottom and a small width at the top. The large external area of the collector 64 provides a large surface for conducting heat to an encapsulation means (not shown). Thus, the mesa type transistor provides a large heat removal and large power dissipation which may be of the order of 150 milliwatts or larger. The collector 64 may have a surface such as 65 having a square configuration for ease of encapsulation or may have other configurations.

Positioned on a top surface 66 of the collector 64 and diffused through the surface 66 into the collector 64 is a base 67 having a thickness W of 1 micron and a circular external shape. The base 67 forms a collector-base junction at the interface 66. The base 67 is of n-type germanium material and has an antimony impurity concentration varying from the collector junction at the interface 66 with a concentration of $10^{14}$ atoms/cm.³ to $10^{18}$ atoms/cm.³ at the surface 68 of an emitter 72 to provide the required drift field $\Delta V$. The drift field allows minority carriers to pass through the base region limited only by the transit-time thereof. The impurity gradient may be introduced into the base region by diffusion of impurities through its top surface 73 from material in the vapor phase or other suitable means may be utilized for forming the base gradient such as rate growth or epitaxial growth with a varying impurity concentration.

Evaporated onto the base top surface 73 through a suitable mask and then alloyed to the base 67 is the emitter 72 which is of a suitable p-type material. The emitter 72 may be formed by aluminum evaporation and subsequent shallow alloying to a small depth of approximately ¼ micron. The emitter 72 has a circular shape concentric with the surface 73 and is of a small diameter to minimize the emitter capacitance $C_e$. To form a contact to the base, an ohmic base contact or ring 74 of approximately 300 angular degrees for simplicity of masking is evaporated and then alloyed through a mask to the surface 73. The ring 74 may be an alloy of 98% gold and 2% antimony. A collector electrode 76, a base electrode 78 and an emitter electrode 79 are then attached to the respective elements by thermal compression bonding and the structure of the transistor is encapsulated in a suitable container (not shown).

To consider the base resistance and collector capacitance requirements of the circular mesa transistor, the base resistance $r_b'$ may be approximately expressed as:

$$r_b'=\frac{\bar{\rho}}{2\pi W}\ln\frac{R_2}{R_1} \quad (14)$$

$\bar{\rho}$ is the integrated resistivity across the base region in ohms-cm.$\cong$.01 ohm-cm.

W is the thickness of the base region 67 of FIG. 9 which is $10^{-4}$ cm.

$R_1$ is the radius of the emitter 72 as shown in FIG. 8 which is 4 mils.

$R_2$ is the inside radius of the circular base ring 74 as shown in FIG. 8 amounting to 8 mils.

Thus, in the transistor of FIGS. 8 and 9

$$r_b'=\frac{.01}{2\pi 10^{-4}}\ln\frac{8}{4}\simeq 10 \text{ ohms}$$

Although the base resistance $r_b'$ may be made smaller than 10 ohms by decreasing the average resistivity $\bar{\rho}$, this change must be considered relative to surface concentration, which in turn will decrease the emitter efficiency.

The collector capacitance $C_c$ for the circular mesa transistor discussed herein may be expressed as $$C_c=\frac{.088\epsilon A_c}{d_{sc}}[\text{mmf.}] \qquad (15)$$

where $\bar{\rho}$ is the dielectric constant of germanium, i.e. 16.

$A_c$ is the area of the collector-base junction, that is, the surface 66 of FIG. 9 being approximately $3\times10^{-4}$ cm.$^2$.

$d_{sc}$ is the space charge width which is a function of the collector voltage and approximately equals $1\times10^{-4}$ cm.

Therefore, for the transistor of FIGS. 8 and 9:

$$C_c=\frac{16(.088)(3\times10^{-4})}{1\times10^{-4}}\simeq4\text{ mmf.}$$

The collector capacitance $C_c$ may be varied within practical limitations by selecting the area of the collector-base junction. It has been found that the parametric transistor is operable with a $C_c$ of between 2 and 4 mmf. and an $r_b'$ less than 20 ohms to provide a sufficiently high $r_b'C_c$ cut-off frequency $f_c$. Thus, the maximum allowable $r_b'C_c$ product of the transistor of this invention is $80\times10^{-12}$ seconds. It is to be noted that theoretical studies indicate that $r_b'$ can be reduced to 5 ohms and $C_c$ to 1 mmf., e.g. a collector cut-off frequency $f_c \cong 32$ kmc.

The frequency limitation of the circular mesa transistor will now be further considered. The drift field $$\Delta V=8\frac{KT}{q}=.2\text{ volt}$$

and the cut-off frequency $f_c$ is selected as 3,000 mc.

Thus, $$A=\frac{\Delta Vq}{KT}=8$$

and from Equation 7, $$m=0.21+0.1\times8=1.01$$

Substituting for the $\alpha$ current generator into Equation 2 and assuming $\alpha_0$ is 1, $$\alpha=\frac{1\text{ exp. }(-j1.01f/3000)}{1+jf/3000}$$

where $f$ is the frequency in megacycles. The $r_b'C_c$ cut-off frequency $f_c$ when $r_b'=10$ ohms and $C_c=4$ mmf. from Equation 11 is:

$$f_c=\frac{1}{2\pi r_b'C_c}\simeq4\text{ kmc.}$$

The emitter cut-off frequency can be computed from Equation 9 for $C_e=4$ mmf. and $r_e=2.5$ ohms at 10 ma. emitter current $$f_e=\frac{1}{2\pi2.5\times4\times10^{-12}}=16\text{ kmc.}$$

Thus, the mesa transistor that may be utilized in this invention has a small emitter-to-base area to provide a small $C_e$ so that the emitter cut-off frequency is substantially larger than the $r_b'C_c$ cut-off frequency $f_c$. The emitter cut-off frequency $f_e$ does limit the transistor for mixing as will be discussed subsequently because mixing cannot be performed beyond $f_e$.

The $\alpha$ cut-off frequency $f_b$ which is a function of base thickness and the factor A from Equation 13 is:

$$f_b=\left(\frac{1.21\times.44}{\pi\times10^{-8}}\right)(8)^{3/2}=3.7\text{ kmc.}$$

In practice the measured $f_b$ is much lower than this theoretical value. The measured value has been found to be 1.0 kmc. Thus, the condition is met in the circular mesa transistor that the $\alpha$ cut-off frequency $f_b$ is surpassed by $f_e$ and $f_c$.

Now that the characteristics and structure of the parametric transistor have been defined, improved circuits in accordance with this invention will be explained. The circuit of FIG. 10 operates as a mixer oscillator or converter to give conversion gain with the transistor in continuous oscillation in a self-pumping mode which is quasi-parametric.

Figure 10:
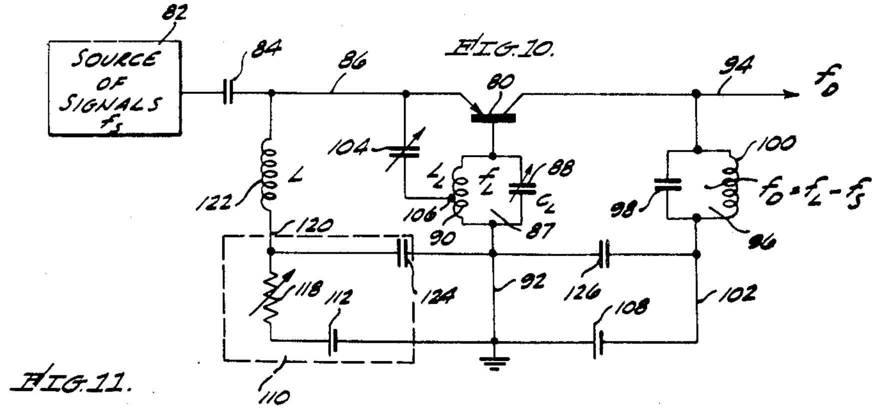
FIG. 10 is a schematic circuit diagram of a mixer oscillator circuit utilizing the transistor of the invention.

The circuit includes a parametric transistor 80 as discussed above which may be of the p-n-p type. The circuit responds to signals at a fundamental or signal frequency $f_S$ from a source 82 applied through a coupling capacitor 84 and a lead 86 to the emitter of the transistor 80 to develop difference signals at a frequency $f_D$ which appear on a lead 94 coupled to the collector thereof. In order that the circuit operates as a grounded base oscillator, the base of the transistor 80 is coupled to a tuned circuit 87 including a parallel capacitor 88 having a value $C_L$ and an inductor 90 having a value $L_L$ connected through a lead 92 to ground. This circuit is thus a base-tuned grounded-base oscillator. The tuned circuit 87 is tuned to a local oscillator frequency $f_L$ as will be discussed subsequently. The lead 94 is also connected to a tuned circuit 96 which includes a capacitor 98 and an inductor 100 connected in parallel between the lead 94 and a lead 102. The circuit 96 is tuned to a difference frequency $|f_L-f_S|$ or $|(n\times f_L)-f_S|$ where $n$ is an integer because the circuit may operate at selected higher harmonics of the oscillator frequency. For operation at the higher harmonics, a tuning circuit such as 208 of FIG. 15 tuned to a quarter wave length may be coupled to the lead 94. The tuned circuit 208 when included in the circuit of FIG. 10 is tuned at a frequency $f_L$ or $nf_L$. To maintain oscillator in the circuit, feedback is provided by coupling a variable capacitor 104 between a tap point 106 on the inductor 90 and the lead 86. For proper biasing, a battery 108 has the positive terminal connected to ground and the negative terminal connected to the lead 102. A variable source of potential 110 for current tuning of the transistor 80 includes a battery 112 having a negative terminal connected to ground and a positive terminal connected through a variable resistor 118 to a lead 120. An inductor 122 having a value L is connected between the lead 120 and the lead 86 to provide the desired input impedance characteristics for matching the capacitance of the transistor 80 by adjusting the D.C. current applied from the source 110. To remove undesired high-frequency components from the batteries 112 and 108 a by-pass capacitor 124 is coupled from the lead 120 to the ground lead 92 and a by-pass capacitor 126 is coupled between the lead 102 and the ground lead 92. It is to be noted that the source 110 may be any conventional adjustable current source.

In operation as a mixer amplifier, the feedback capacitor 104 is adjusted so that the oscillatory wave fed back to the emitter of the transistor 80 has the proper phase angle in order that continued oscillation is maintained. In addition, to provide amplification, the emitter loop is current tuned to provide a parallel-resonant condition between the inductor 122, the capacitance of the transistor 80 and the inductance of the tuned circuit 87. The required value of L is obtained by adjusting the D.C. current therethrough by varying the variable resistor 118. The current tuning controls an A.C. (alternating current) operation by D.C. tuning.

For further explaining the current tuning operation, the input impedance $h_{ib}$ at the emitter of the transistor 80 is adjusted by varying the D.C. current flowing through the inductor 122 until the input impedance at a D.C. current is approximately real, that is at point 32 of FIG. 4 when $f_L$ is 350 mc. The current tuned condition is a resonant condition where the input impedance of the emitter of the transistor 80 is matched to the value of L. This current tuning is accomplished for a selected frequency of operation $f_L$ and with the proper feedback adjustment by varying the capacitor 104 the circuit continues to operate to develop a difference signal at the selected difference frequency $f_D$.

The mixing operation is performed in the emitter-to-base junction of the transistor 80 in response to the value of L and certain values of the emitter current $I_e$. When the transistor 80 is in oscillation, the input impedance of the transistor 80 varies along the curve 30 of FIG. 4 above and below the tuned point 32 and may vary along the non-linear portion close to the point 32 or between the upper and lower curved portions of the curve 30. This non-linear variation of reactance develops harmonic signal power which is mixed with the signals from the source 82, amplified by the transistor 80 and detected across the tuned circuit 96.

The operation of the circuit can be explained by the fundamental differential equation:

$$\frac{d^2Q}{dt^2}+\frac{1}{LC(f)}Q=0 \qquad (16)$$

where

Q is the charge at the emitter base junction which is varied in time and can also be expressed in emitter current variation in time and L is the fixed value of the inductor 122.

C(f) is a capacitance variable with frequency determined from the capacitive reactance of the input impedance $h_{ib}$ of the transistor 80 as shown by the variation of the curve 30 of FIG. 4 and can be expressed by $$C(f)=C_0[1+2K\cos(2\pi f_L t)]$$

where $C_0$=a fixed capacitance at the D.C. bias point,

K is a constant and proportional to the amplitude of the signal, and $f_L$ as before is the tuned local oscillator frequency of the circuit 87 at the base of the transistor 80.

The output voltage of the circuit is then $$L\frac{d^2Q}{dt^2}$$

where Q is a function of emitter current variation.

This differential Equation 16 predicts that at $\frac{1}{2}f_L$ and $nf_L$, solutions are possible. This Equation 16 shows that the transistor utilized in the invention has a reactance that varies non-linearly as a function of frequency and can be used as a parametric amplifier.

Figure 15:
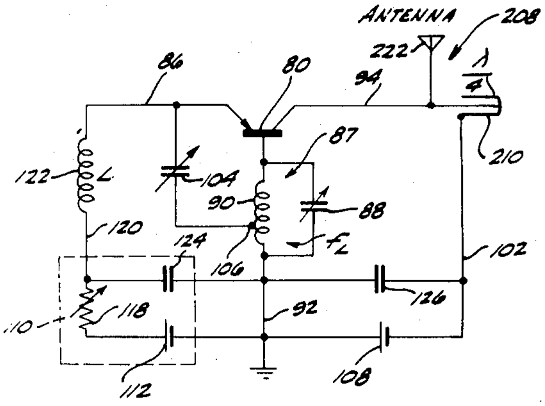
FIG. 15 is a circuit diagram of a harmonic power generator utilizing the transistor in accordance with this invention.
Figure 11:
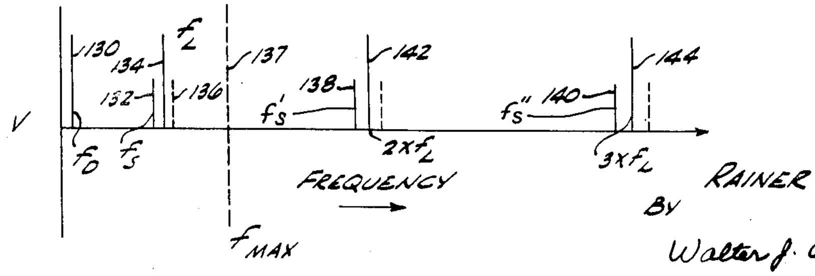
FIG. 11 is a spectral diagram of voltage versus frequency for explaining the operation of the mixer oscillator circuit of FIG. 10.

The transistor 80 as a result of the non-linear characteristics of the input impedance at the emitter junction provides mixing at $n$ times the local oscillator frequency $f_L$ so that the difference frequency $f_D$ on the lead 94 is $|(n.f_L)-f_S|$. It is to be again noted that for operation with $n$ greater than 1, a tuned circuit such as 208 of FIG. 15 is coupled to the lead 94. Thus, a selected difference frequency $f_D$ is obtained when utilizing signals from the source 82 at a frequency $f_S$ substantially greater than the maximum frequency of oscillation of the transistor. As shown in the spectral diagram of FIG. 11 the difference signal 130 at a frequency $f_D$ may be obtained by mixing an input signal 132 at frequency $f_S$ when the base circuit 87 is tuned to a frequency $f_L$ shown at 134. It is to be noted that the signal 132 has an image signal 136 shown by a dotted line. This mixing at the frequency $f_L$ is below the frequency $f_{MAX}$ as defined by Equation 3. However, the mixing is also performed with the input frequency at $f_S'$ or $f_S''$ for example indicated by respective signals 138 and 140, with the base circuit 87 tuned to $f_L$, a circuit such as 208 coupled to the lead 94 and tuned to $2f_L$ or $3f_L$ and the circuit 96 tuned to $(2f_L-f_S)$ or $(3f_L-f_S)$ so that the mixing is performed by signals 142 and 144 which are harmonics of the signal 134. Thus, in accordance with this invention the frequency $f_S$ may be selected substantially greater than the maximum frequency $f_{MAX}$ with $f_D$ selected at a relatively low frequency while obtaining conversion gain and amplification.

Figure 12:
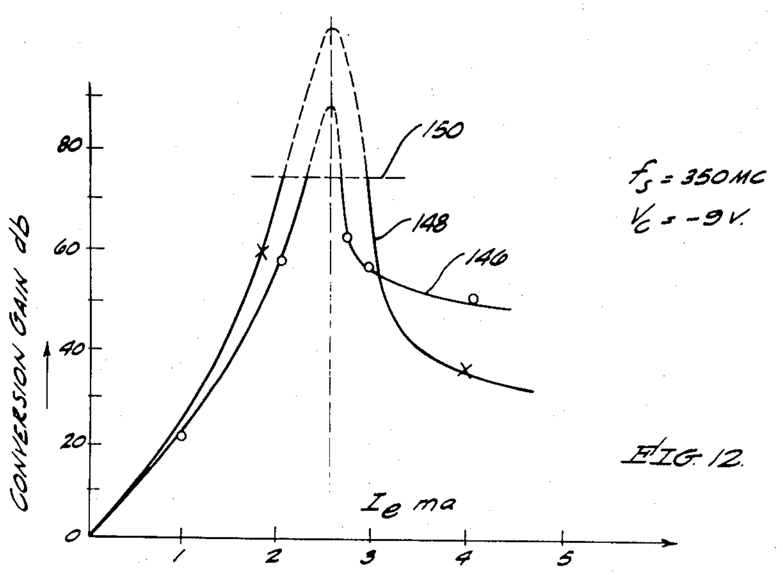
FIG. 12 is a graph of conversion gain versus emitter current for explaining the improved characteristics of the transistor in accordance with this invention when operating in the mixer oscillator circuit of FIG. 10.

To further consider the gain characteristics of the circuit of FIG. 10 the conversion gain and the signal-to-noise ratio are shown respectively in FIGS. 12 and 13 versus emitter current for a fixed signal frequency $f_S$ of 350 mc. Curves 146 and 148 were obtained experimentally for two separate transistor units embodying this invention. As the value of the resistor 118 is varied to change the emitter current flowing through the inductor 122 from 1 to 2 ma. the conversion gain such as shown by the curve 146 varies between approximately 20 db (decibels) to approximately 70 db. At the current tuned point of 2 ma. shown in FIG. 4, the conversion gain is maximum for operation for the low emitter current region between 1 and 2 ma. of the transistor 80.

Above a level 150 where the curves 146 and 148 are shown dotted, the circuit operation has been found to be unstable. At an emitter current region between approximately 3 to 4 ma., the curves 146 and 148 show that stable operation is also provided with a decreasing conversion gain when the transistor 80 is tuned to higher emitter currents.

Considering the signal-to-noise ratio of the difference signal obtained from the lead 94 when utilizing the transistor of the curve 146, a curve 154 (FIG. 13) shows that the signal-to-noise ratio increases from approximately 5 to 20 db as the emitter current applied to the transistor 80 is varied between approximately 1 and 2 ma. Also, the signal-to-noise ratio decreases when the emitter current is varied in the region between approximately 3 to 4 ma. However, in this region a slightly lower signal-to-noise ratio is obtained for the same conversion gain as in the region of lower emitter current. Thus, it is seen that operation with the greatest conversion gain and the lowest absolute noise figure is obtained when the circuit is current tuned to approximately 2 ma.

To consider the conversion gain versus frequency of the mixer oscillator in accordance with this invention, a curve 158 of FIG. 14 shows the variation of conversion gain when the input signal is changed to a higher frequency and with $f_L$ selected near or below the maximum frequency of oscillation of the transistor. At each frequency of $f_S$ the mixer circuit is current tuned by varying the resistor 118 so that maximum conversion gain is obtained such as shown by the current tuned point 32 of FIG. 4.

A dotted curve 160 in FIG. 14 shows the circuit characteristics without feedback (capacitor 104) and the curve 158 is obtained with the feedback capacitor of FIG. 10. A point 164 on the curve 158 shows the circuit conversion gain when the frequency $f_S$ of the input signal from the source 82 is 348 mc. corresponding to the signal 132 of FIG. 11. The frequency $f_S$ at the point 164 is selected slightly below the cut-off frequency $f_{MAX}$ as defined by Equation 3. It is to be noted that operating under the conditions shown at the point 164, the conversion gain (70 db) and the signal-to-noise ratio (14 db) are maximum. A point 166 shows operation when the frequency $f_S$ of the input signal developed by the source of signals 82 is 698 mc. corresponding approximately to the signal 138 of FIG. 11. It can be seen that when operating at the point 166, the conversion gain has decreased to approximately 49 db and the signal-to-noise ratio has decreased to 12 db. Similarly at points 170 and 172 where $f_S$ is respectively 1048 mc. and 1398 mc., the conversion gain and the signal-to-noise ratio decrease but the conversion gain is substantially above unity. Thus, the conversion gain is a function of frequency and the transistor operates to develop difference signals at frequencies above the maximum frequency of oscillation of the transistor by developing harmonics of the oscillatory wave. The emitter cut-off frequency $f_e$ is the limit of operation of the transistor utilized in this invention but because this cut-off point is relatively high as previously discussed, this is not a substantial limitation to high frequency operation.

The characteristics in accordance with this invention will now be further explained by reference to FIG. 15 illustrating a harmonic power generator. The circuit of FIG. 15 is essentially the same as that of FIG. 10, and hence, only those elements which have been changed will be explained. In the power generator of FIG. 15 signal source 82 and coupling capacitor 84 have been omitted. The tuned output circuit 96 of FIG. 10 has been removed and the resonant circuit 208 is provided which may include a tuned coaxial cable 210 having an inner conductor connected through the lead 94 to the collector of the transistor 80. It is to be noted that other suitable means may be utilized for the resonant circuit 208 such as a cavity resonator. The outer conductor of the coaxial cable 210 is connected through lead 102 to the battery 108. In order to radiate harmonic power from the lead 94 an antenna 222 may be connected thereto.

It is to be noted that for some applications the capacitor 88 may be omitted. In that case, the capacitor 104 with the inductor 122 and a portion of the inductor 90 form a tuned circuit which determines the fundamental frequency of operation of the transistor.

The coaxial cable 210 may be tuned to a quarter wavelength at the operating frequency or to an odd multiple of a quarter wavelength thereof, thereby to provide power to the antenna 222 at the selected harmonic frequency. In other words, the length of the coaxial cable 210 may be $$\left(\frac{2n-1}{4}\right)\lambda$$

where $\lambda$ is the wavelength and $n$ any integer.

In operation, the circuit is current tuned by adjusting the resistor 118 to adjust the D.C. emitter current so that the point of maximum conversion gain and maximum signal-to-noise ratio such as a point 32 of FIG. 4 is obtained. The capacitor 104 is adjusted so a portion of the oscillatory wave is fed back at the proper phase angle to maintain oscillation of the circuit, and the tuning means 208 is selected to respond to a desired harmonic multiple of the frequency $f_L$. The circuit thus exhibits a power gain U greater than unity in narrow frequency bands above $f_{MAX}$ as shown in FIG. 5. The transistor 80 oscillates at a fundamental tuned frequency $f_L$ below the frequency $f_{MAX}$. The harmonic wave at the output lead 94 is selected at the asymptote of curves 38 and 40 (FIG. 5) such as the fifth harmonic where the conversion gain is greater than 1 so as to obtain maximum output power, or at the asymptote of curves 42 and 44 such as the ninth harmonic. This harmonic selection is accomplished by tuning the tuning arrangement 208. Thus, the harmonic generator of FIG. 15 develops power at selected harmonics above the maximum frequency of oscillation of the transistor 80.

The principles of the parametric mode transistor utilized in this invention are equally applicable to p-n-p and n-p-n type transistors. It is to be noted that the principles of the invention are not limited to p-n-p type parametric mode transistors but n-p-n type may be utilized by properly reversing the circuit polarities.

It has been found that in the circuit of FIG. 15 operating at a fundamental frequency of oscillation of 220 mc., which is below $f_{MAX}$, and with 12 mw. (milliwatt) power, the ninth harmonic on the lead 94 has .23 mw. of power at 1.98 kmc. It is to be noted that it is presently believed that an external pumping source applied to the emitter of transistor 80 in FIG. 15 would provide complete parametric operation to produce the standing waves across the base region.

It is believed that the transistor utilized in this invention can be operated beyond the maximum frequency of oscillation defined by Equation 3 which did not consider the field factor $m$. It is believed that by reducing the parasitic elements outside of the intrinsic transistor as shown schematically in FIG. 1, the transistor in accordance with this invention will oscillate with a fundamental frequency above $f_{MAX}$. The extrinsic parasitic element of FIG. 1 may be substantially eliminated by mounting the transistor of FIG. 8 on a ceramic disk with metal ribbons as electrodes coupled to the emitter, base and collector. This arrangement reduces the inductances and minimizes the capacitances of the extrinsic transistor. Therefore, it is believed that by reducing the extrinsic parasitic elements of the transistor as discussed above, the transistor will oscillate above the maximum frequency defined by Equation 3.

Figure 16:
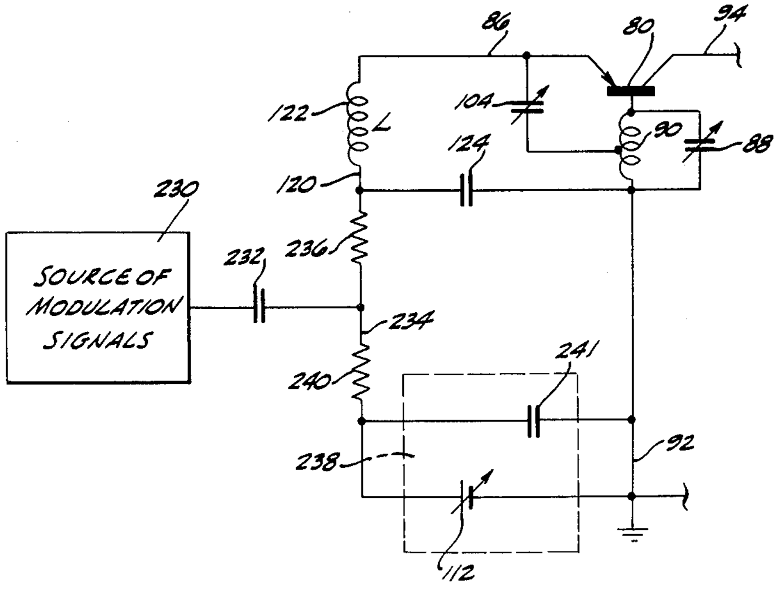
FIG. 16 is a schematic circuit diagram of an arrangement for modulating the harmonic signals developed by the circuit of FIG. 15 with an RC (resistance-capacitance) coupling arrangement.
Figure 17:
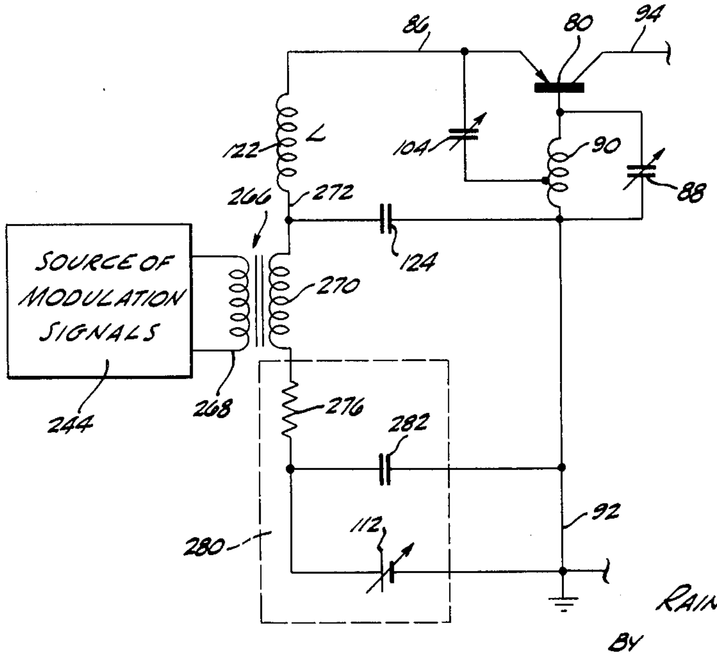
FIG. 17 is a schematic circuit diagram of an arrangement for modulating the harmonic signals developed by the circuit of FIG. 15 with a transformer coupling arrangement.

The signals developed by the harmonic generator circuit of FIG. 15 can also be modulated as shown in FIG. 16 by an R-C coupling and a transformer coupling arrangement illustrated in FIG. 17. A source of modulation signals 230 in FIG. 16 applies a modulated current signal through a coupling capacitor 232 to a lead 234. The modulated signal may be a sine wave varying in either frequency or amplitude or varying in both. The lead 234 is coupled to the lead 120 through a resistor 236 and to a variable source of current 238 through a resistor 240. The divider arrangement of the resistors 236 and 240 provides impedance matching with the source 230 with the relatively small input impedance of the transistor 80. To provide the current tuning, the battery 112 may be made variable rather than the resistor 118 of FIG. 15. A capacitor 241 is coupled between the resistor 240 and the ground lead 92 for providing a by-pass to high frequency components in addition to the by-pass capacitor 124.

In the transformer coupling arrangement of FIG. 17 a source of modulation signals 244 similar to the source 230 is provided coupled through a transformer 266 to the inductor 122. The transformer 266 includes a primary winding 268 coupling the source 244 to a secondary winding 270 which in turn is coupled at one end to the inductor 122 through a lead 272 and at the other end to a resistor 276 of a variable source of direct current 280. The battery 112 is shown variable to adjust the D.C. emitter current for the current tuning as previously explained. A by-pass capacitor 282 is coupled from the junction between the resistor 276 and the battery 112 to the lead 92. In addition the by-pass capacitor 124 also by-passes high-frequency components. The transformer coupling arrangement of FIG. 17 has the resistor 276 and the impedance of the transformer 266 matched to the input impedance of the source 244 to provide emitter current modulation with a minimum of distortion of the harmonic signals.

In operation the circuits of FIGS. 16 and 17 modulate the emitter current applied to the transistor 80 when the circuit is oscillating so that the harmonic signals developed on the lead 94 are modulated. The sine waves developed by the current sources 230 and 244, at a frequency no greater than the maximum frequency of oscillation as determined by the local oscillator frequency $f_L$, may be modulated in either frequency or amplitude or both. It is believed that a similar modulation is present on the harmonic signals developed on the lead 94.

Thus, there has been described circuits utilizing a parametric mode transistor to provide amplification and power gain beyond the normal maximum frequency of oscillation. A specific transistor structure that may be utilized in this invention is a ring type mesa transistor having a relatively high power rating. A mixer-oscillator circuit provides conversion gain when mixing with a fundamental input signal above the conventional maximum frequency of oscillation and a harmonic power generation circuit delivers power at harmonic frequencies substantially greater than the conventional maximum frequency of oscillation.

What is claimed is:

1. A signal translating device comprising a transistor capable of operating in a quasi-parametric mode and having emitter, base and collector electrodes, said emitter electrode having a non-linear reactive input impedance, a fixed inductor coupled to said emitter electrode, a variable source of direct current coupled to said fixed inductor, a resonant circuit coupled to said base electrode, feed-back means coupled between said resonant circuit and the emitter of said transistor, tuned means coupled to said collector electrode, and means for intercoupling said variable source of direct current, said resonant circuit and said tuned means, whereby varying said source of direct current controls said input impedance to provide quasi-parametric operation with said fixed inductor so that harmonic power is developed when said device oscillates.

2. A circuit for developing harmonic waves with substantial power at relatively high frequencies comprising a transistor having emitter, base and collector electrodes and having an input impedance that varies from inductive to capacitive and back to inductive reactance with increasing frequency of oscillation, said input impedance at a selected frequency changing between inductive and capacitive with varying direct current applied to said emitter electrode, a resonant circuit coupled to said base electrode and tuned to said selected frequency, an inductor having one end coupled to said emitter electrode, a variable source of direct current coupled to the other end of said inductor for changing the input impedance at said selected frequency of said transistor to a selected capacitive reactance so as to be in resonance with said inductor at said selected frequency, feedback means coupled between said resonant circuit and said emitter electrode, output means coupled to said collector electrode and tuned to a desired harmonic of said selected frequency, and means intercoupling said resonant circuit, said variable source of direct current and said output means, whereby said desired harmonic waves are developed with substantial power.

3. A circuit for developing modulated harmonic signals with power at relatively high frequencies comprising a parametric mode transistor having emitter, base and collector electrodes and having an input impedance that varies from inductive to capacitive and back to inductive reactance with increasing frequency of oscillation, said input impedance at selected frequencies changing between capacitive and inductive with varying direct current applied to said emitter electrode, said transistor having a maximum frequency of oscillation, an inductor having a first end coupled to said emitter electrode, a source of variable direct current coupled to a second end of said inductor, a resonance circuit coupled to said base electrode and tuned to a frequency below the maximum frequency of oscillation of the transistor, feedback means coupled between said resonance circuit and said emitter electrode, tuning means coupled to said collector electrode and tuned for selecting a desired harmonic signal, current modulating means coupled to said inductor, and connecting means coupled between said source of variable direct current, said resonance circuit and said tuning means, whereby the harmonic signal selected at a frequency greater than the maximum frequency of oscillation of the transistor has a substantial amount of power and said harmonic signal is modulated in accordance with said modulating means.

4. A circuit for developing harmonic waves with power comprising a junction transistor having emitter, base and collector electrodes, said emitter electrode having a complex input impedance varying successively from inductive to capacitive and back to inductive reactance with increasing frequency of oscillation, said input impedance at a selected frequency of oscillation varying in capacitive reactance with variation of direct current applied to said emitter, a resonant circuit coupled to said base electrode, feedback means coupled between said resonant circuit and said emitter electrode for maintaining circuit oscillation, tuned means coupled between said collector electrode and said resonant circuit, an inductor having one end coupled to said emitter electrode, a variable source of direct current coupled between the other end of said inductor and said resonant circuit, whereby when the source of direct current is varied, said complex input impedance is tuned to effect a pronounced nonlinear impedance which develops harmonic waves with power.

5. A harmonic generator circuit for developing harmonic waves with substantial power comprising a junction transistor operable with conversion gain above the maximum frequency of oscillation and having emitter, collector and base electrodes, said transistor having a nonlinear input reactance which is a function of the current amplification factor as determined by transistor characteristics in the microwave frequency range, an extrinsic base resistance of not more than 20 ohms, a collector depletion layer capacitance of not over 4 micro-microfarads and an electric drift field not less than $$4\frac{KT}{q}$$

where K is Boltzman's constant, T is temperature in degrees Kelvin and $q$ is the electron charge in coulombs, a resonant circuit coupled to said base electrode, feedback means coupled between said resonant circuit and said emitter electrode, an inductor having a first and second end, said first end being coupled to said emitter electrode, a variable source of direct current coupled to the second end of said inductor for adjusting said non-linear input reactance to effect a pronounced non-linear operation, output circuit means coupled to said collector electrode, and interconnecting means coupled to said resonant circuit, said variable source of direct current and said output circuit means, whereby said generator develops harmonic waves with substantial power above said maximum frequency of oscillation.

6. A harmonic power generator comprising a junction transistor having emitter, base and collector electrodes, said emitter electrode having a non-linear input reactance characteristic, said transistor having a maximum frequency of oscillation, said transistor, in the microwave frequency range, having an extrinsic base resistance and a collector depletion layer capacitance product of not over $80\times10^{-12}$ seconds and an electric drift field not less than $$4\frac{KT}{q}$$

where K is Boltzman's constant, T is temperature in degrees Kelvin nad $q$ is the electron charge in coulombs, said transistor thus having a non-linear input reactance at said emitter electrode for developing harmonic power, a resonant circuit coupled to said base electrode and tuned to a fundamental frequency no greater than said maximum frequency of oscillation, a tuned circuit coupled between said collector electrode and said resonant circuit, a feedback capacitor coupled between said resonant circuit and said emitter electrode, a variable source of direct current, coupled to said resonant circuit and to said tuned circuit, an inductive element coupled between said emitter electrode and said variable source of direct current, said source of direct current thus being variable until an input impedance is present to effect pronounced non-linear operation, and a source of modulation signals coupled between said inductive element and said variable source of direct current for modulating the emitter current to develop modulated signals with substantial power above said maximum frequency of oscillation, said circuit thus developing harmonic signals with power.

(References on following page)

References Cited by the Examiner

UNITED STATES PATENTS

| | | | |
|---|---|---|---|
| 2,816,220 | 12/1957 | Goodrich | 325—451 |
| 2,841,703 | 7/1958 | Bopp et al. | 250—20 |
| 2,879,480 | 3/1959 | Reed | 331—108 X |
| 2,890,417 | 6/1959 | Sanders | 332—16 |
| 2,891,159 | 6/1959 | Politi et al. | 331—108 |
| 2,920,289 | 1/1960 | Meyer | 332—16 |
| 2,960,665 | 11/1960 | Jackson | 331—108 |
| 2,963,578 | 12/1960 | McCreary | 250—20 |

OTHER REFERENCES

"New Transistor Design—The Mesa," by Knowles in Electronic Industries, vol. 17, No. 8, August 1958, pps. 55–60.

"Transistor Operation Beyond Cutoff Frequency" by Vodicka et al., in Electronics, August 26, 1960, pages 56–60.

ROY LAKE, *Primary Examiner.*

SAMUEL B. PRITCHARD, JOHN KOMINSKI, *Examiners.*

J. B. MULLINS, P. A. ROBEY, *Assistant Examiners.*